United States Patent [19]

Chio

[11] Patent Number: 5,170,117
[45] Date of Patent: Dec. 8, 1992

[54] SOCKET FOR TESTING A PLUG-IN TYPE SEMICONDUCTOR

[76] Inventor: Chuy-Nan Chio, Fl. 9-3, No. 333, Fu-Hsing N. Rd., Taipei City, Taiwan

[21] Appl. No.: 857,668

[22] Filed: Mar. 26, 1992

[51] Int. Cl.⁵ .............................................. G01R 1/02
[52] U.S. Cl. ............................ 324/158 F; 324/158 P; 439/263; 439/264
[58] Field of Search ................... 439/263, 264, 70, 73, 439/268; 324/158 P, 158 F, 72.5

[56] References Cited

U.S. PATENT DOCUMENTS

| | | | |
|---|---|---|---|
| 3,997,227 | 12/1976 | Cutchaw | 439/73 |
| 4,314,736 | 2/1982 | Demnianiuk | 439/264 |
| 4,375,309 | 3/1983 | Griffin | 439/264 |
| 4,377,319 | 3/1983 | MacDougall | 439/264 |
| 4,611,870 | 9/1986 | Beers | 439/263 |
| 4,714,879 | 12/1987 | Krause | 324/158 F |
| 4,950,980 | 8/1990 | Pfaff | 324/158 F |
| 5,065,941 | 11/1991 | Suzuki | 439/264 |

FOREIGN PATENT DOCUMENTS

| | | | |
|---|---|---|---|
| 1536462 | 1/1990 | U.S.S.R. | 439/264 |
| 1545336 | 2/1990 | U.S.S.R. | 439/264 |

*Primary Examiner*—Kenneth A. Wieder
*Assistant Examiner*—William J. Burns
*Attorney, Agent, or Firm*—Beveridge, DeGrandi & Weilacher

[57] ABSTRACT

A socket for testing a plug-in type semiconductor having two rows of flat pins includes an elongated base having two rows of resilient conductive clamps positioned on the base and an elongated cover mounted on the base and having rows of openings correspondingly formed in the cover with respect to the conductive clamps. A push member is movably mounted between the cover and the base. A camming rod member is mounted between the cover and base for actuating the push member to depress the resilient conductive clamps, urging the resilient conductive clamps to contact the flat pins of the semiconductors when the flat pins are plugged into the socket. Each of the resilient conductive clamps has clamping faces parallel to the contacting faces of the flat pins of the semiconductor. The push member includes a pair of U-shaped members which are moved with respect to each other in a direction perpendicular to the contacting faces of the flat pins of the semiconductor by the camming rod member to enable the side plates to depress the clamping faces of the resilient conductive clamps to contact the contacting faces of the flat pins of the semiconductor.

1 Claim, 4 Drawing Sheets

SOCKET FOR TESTING A PLUG-IN TYPE SEMICONDUCTOR

BACKGROUND OF THE INVENTION

1. Field of the Invention

This invention relates to a socket for testing a plug-in type semiconductor, more particularly to a socket for testing a plug-in type semiconductor which is durable and will not damage the pins of the semiconductor to be tested in operation.

2. Description of the Related Art

Referring to FIG. 1, a conventional socket for testing a plug-in type semiconductor includes a base (A), a cover (B) and a plurality of U-shaped resilient conductive clamps (C). The base (A) has two rows of positioning holes (A1) in which the resilient conductive clamps (C) are inserted. The cover (B) is mounted on the base (A) and has two rows of openings correspondingly aligned with the rows of positioning holes (A1). A push member (E) is movably mounted between the cover (B) and the base (A). The resilient conductive clamps (C) may be depressed to contact with the flat pins (D1) of a semiconductor (D) to be tested by actuating a camming rod member (A2) and moving the push member (E) with respect to the base (A), as best illustrated in FIG. 2. When the flat pins (D1) are in contact with the resilient conductive clamps (C), the semiconductor can be tested. When the camming rod member (A2) is then returned to the original position, the push member (E) is pushed to permit the resilient conductive clamps to disengage from the flat pins (D1) by the restoring force of the resilient conductive clamps. Therefore, the tested semiconductor (D) can be pulled out of the socket, completing a testing operation for one semiconductor. Such a testing operation may be repeated for testing a number of semiconductors. However, such a socket suffers from the following disadvantages:

(1) Because the flat pins (D1) are transversely inserted between the clamping faces of the clamps (C), the legs of the U-shaped clamps are liable to be deformed when the flat pins (D1) are not inserted in the middle section of the legs of the clamps (C) and depressed by the push member, as shown in the phantom line of FIG. 3. Therefore, the socket will quickly be out of order after a number of semiconductors are tested.

(2) The flat pins (D1) may be deformed by the excess clamping force exerted by the resilient conductive clamps (C), as shown in phantom line of FIG. 4, because they are transversely disposed between the legs of the clamps (C).

SUMMARY OF THE INVENTION

It is therefore a main object of this invention to provide a socket for testing a plug-in type semiconductor which is durable and which will not damage the semiconductor.

Accordingly, a socket for testing a plug-in type semiconductor of this invention having two rows of flat pins with two opposite contacting faces includes an elongated base having two rows of resilient conductive clamps positioned thereon and an elongated cover mounted on said base and having rows of openings correspondingly formed in the cover with respect to the conductive clamps. A push member is movably mounted between the cover and the base. A camming rod member is mounted between the cover and base for actuating the push member to depress the resilient conductive clamps, urging the resilient conductive clamps to contact the flat pins of the semiconductors when the flat pins are plugged in the openings of the cover of the socket.

Each of the resilient conductive clamps has clamping faces paralleled with the contacting faces of the flat pins of the semiconductor when the semiconductor is inserted in the socket. The push member includes a pair of U-shaped members which are moved with respect to each other by the camming rod member in a direction perpendicular to the contacting faces of the flat pins of the semiconductor to enable the side plates to depress the clamping faces of the resilient conductive clamps to contact with the contacting faces of the flat pins of the semiconductor.

BRIEF DESCRIPTION OF THE DRAWINGS

Other features and advantages of this invention will become apparent in the following detailed description of a preferred embodiment of this invention with reference to the accompanying drawings, in which.

DETAILED DESCRIPTION OF THE PREFERRED EMBODIMENT

Figure 1:
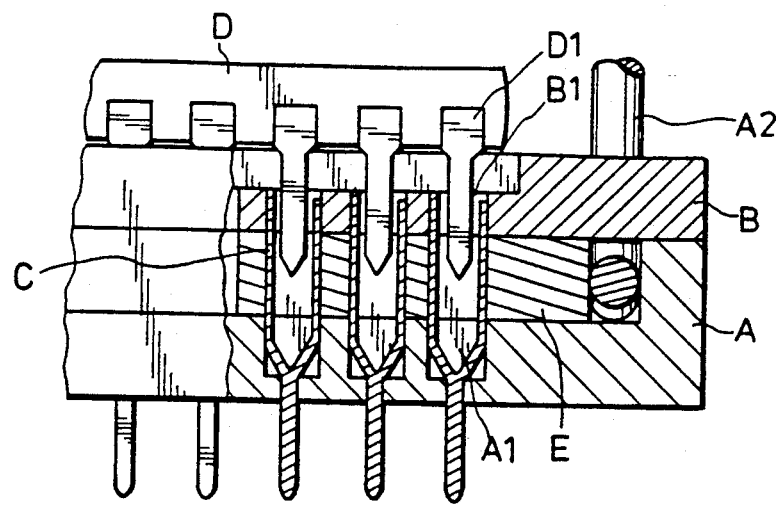
FIG. 1 is a partial sectional view of a conventional socket for testing a plug-in type semiconductor.
Figure 2:
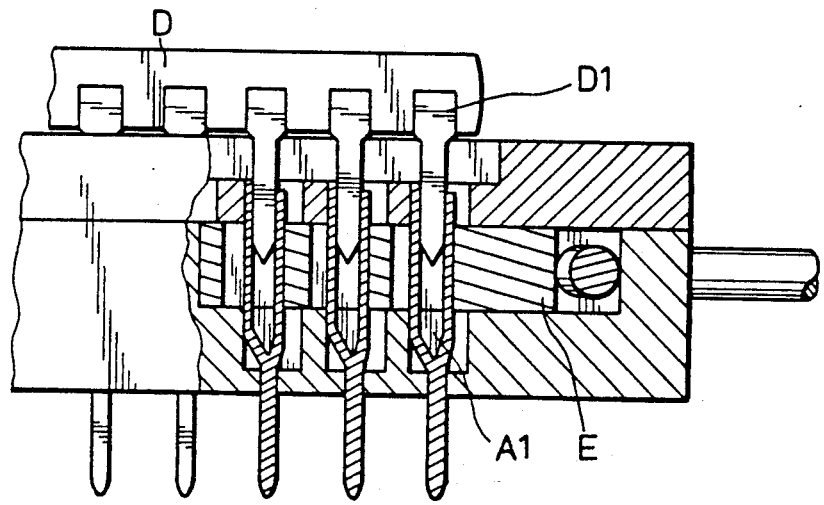
FIG. 2 is a partial sectional schematic view showing the conventional socket for testing a plug-in type semiconductor of FIG. 1 in an operative position.
Figure 3:
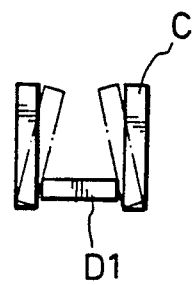
FIG. 3 is a schematic view showing the resilient conductive clamp of the conventional socket for testing a plug-in type semiconductor of FIG. 1 in a first operative position.
Figure 4:
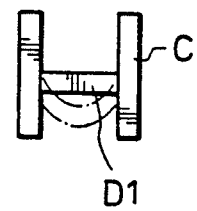
FIG. 4 is a schematic view showing the resilient conductive clamp of the conventional socket for testing a plug-in type semiconductor of FIG. 1 in a second operative position.
Figure 5:
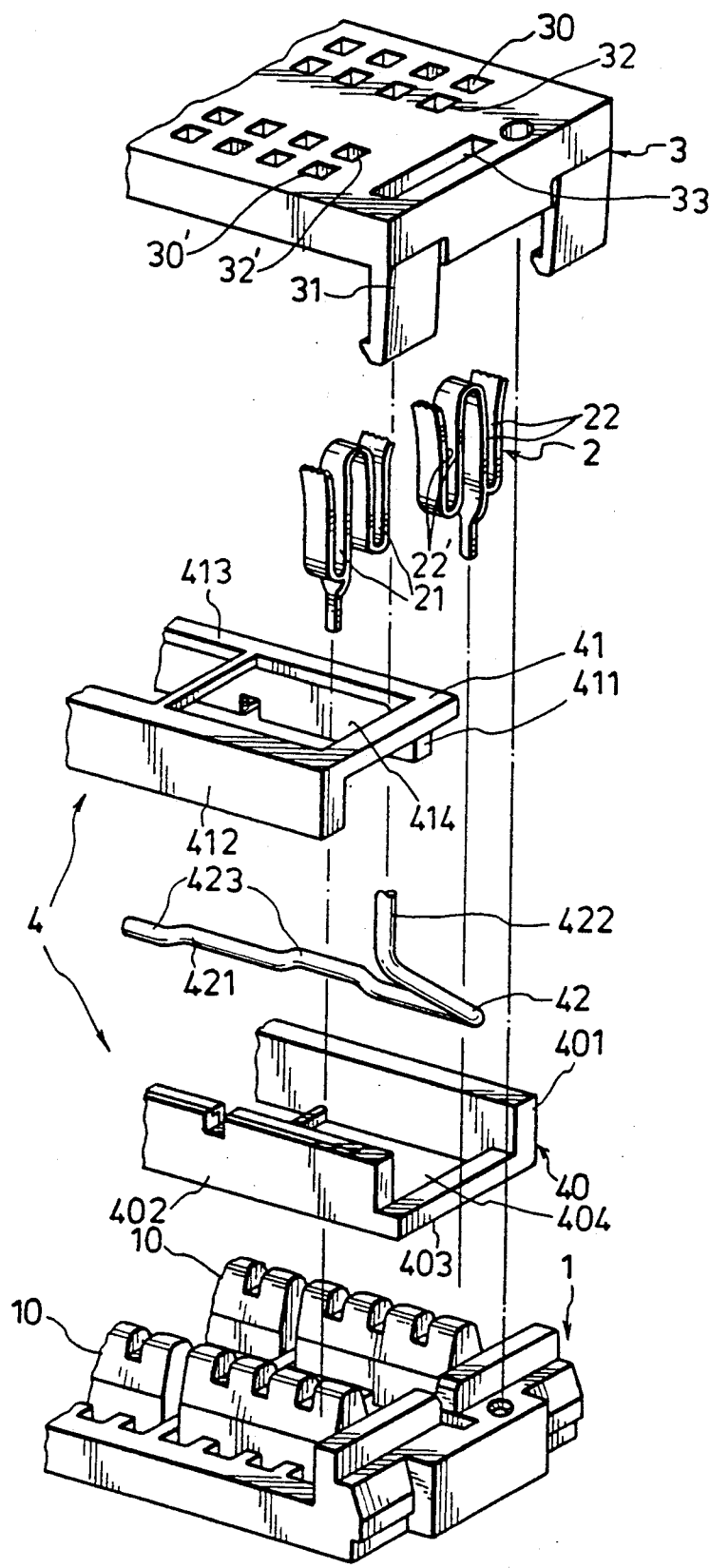
FIG. 5 is a partial perspective exploded view of a preferred embodiment of a socket for testing a plug-in type semiconductor of this invention.
Figure 8:
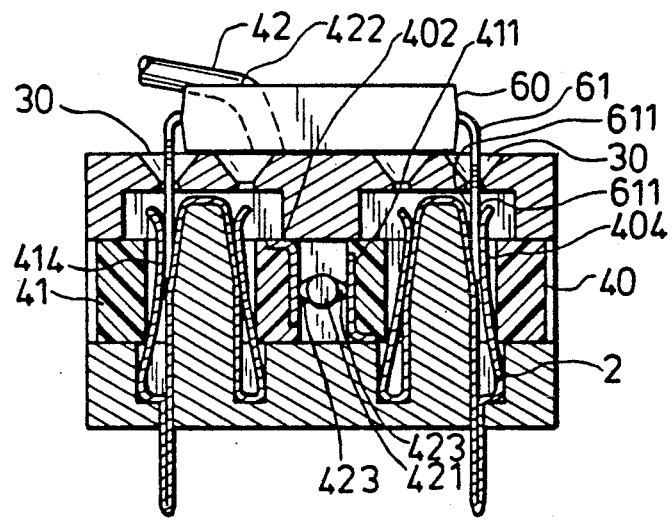
FIG. 8 is a sectional schematic view showing the preferred embodiment of the socket for testing a plug-in type semiconductor of this invention in an operative position.
Figure 9:
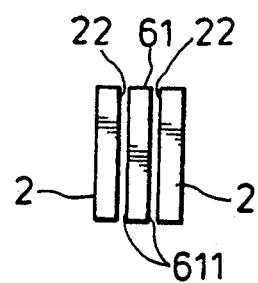
FIG. 9 is a schematic view showing the relative positions of the resilient conductive clamp and a flat pin of a semiconductor according to this invention.

FIG. 5 shows a partial perspective exploded view of a preferred embodiment of a socket for testing a plug-in type semiconductor of this invention. The socket is particularly suitable for testing the plug-in type semiconductor having two rows of flat pins with two opposite contacting faces extending therefrom. The contacting faces of each row of the flat pins are aligned with one another. The socket includes an elongated base 1 having two rows of mounting seats 10 on which two rows of resilient conductive clamps 2 are positioned. An elongated cover 3 is detachably mounted on the base 1 by retaining members 31. A first two rows of the openings 30 and 32 are formed along one side of the cover 3, and a second two rows of the openings 30' and 32' are formed along the other side of the cover 3. The outer rows of openings 30, 30' and the inner rows of openings 32, 32' are respectively designed for semiconductors having different widths. Each of the resilient conductive clamps 2 is generally W-shaped and has two receiving portions 21 and 21' correspondingly aligned with one of the first and the second two rows of the openings 30 and 32 (30' and 32'). Each of the resilient conductive clamps 2 has two pairs of clamping faces 22 and 22' which respectively define the receiving portions 21 and 21' and are parallel to the contacting faces 611 of the flat pins 61 of the semiconductor 60 when the semiconductor 60 is inserted in the socket, as best illustrated in FIGS. 8 and 9.

Figure 6:
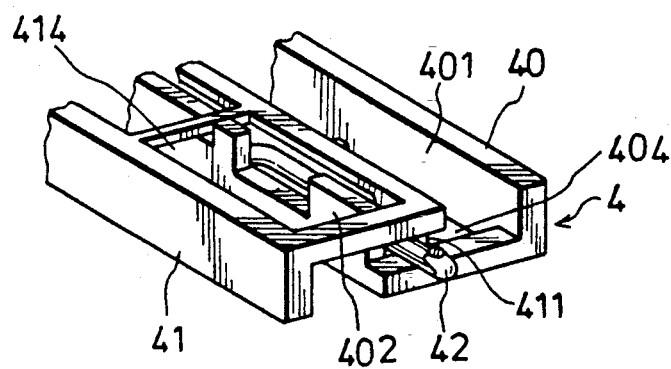
FIG. 6 is a perspective view of a preferred embodiment of a push member of the socket for testing a plug-in type semiconductor according to this invention.
Figure 7:
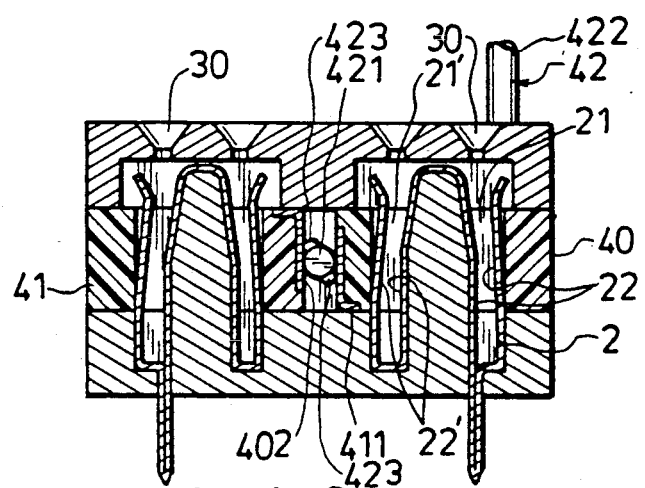
FIG. 7 is a sectional view of the preferred embodiment of the socket for testing a plug-in type semiconductor of this invention.

A push member 4 is movably mounted between the cover 3 and the base 4. The push member 4 includes a pair of U-shaped members 40 and 41 each of which has a base plate 403 (413) and two side plates 401, 402 (411, 412) at two sides of the base plate 403 (413). One of the side plates 411 of one of the U-shaped members 41 extends between the two side plates 401 and 402 of the other of the U-shaped members 40, defining an elongated overlapping section between the U-shaped members 40 and 41 in which a camming rod member 42 is mounted. The camming rod member 42 includes an actuating shank 422 extending out from a slit 33 of the cover 3 and a camming section 421 with two projected portions 423 respectively abutting the side plates 402 and 411 of the push member 4. Each of the base plates 403 (413) of the U-shaped members 40 (41) has an elongated slot 404 (414) through which the rows of resilient conductive clamps 2 pass, as best illustrated in FIGS. 6 and 8. Therefore, the side plates 402 and 411 of the U-shaped members 40 and 41 of the push member 4 can be moved with respect to each other in a direction perpendicular to the contacting faces 611 of the flat pins 61 of the semiconductor when a user actuates the actuating shank 422 of the camming rod member 42 so as to depress the clamping faces 22 of the resilient conductive clamps 2 to contact with the contacting faces 611 of the flat pins 61 of the semiconductor 60 which is inserted into the openings 30 of the socket for testing purposes, as shown in FIG. 8. The semiconductor 60 may be removed from the socket when the user releases the actuating shank 422 of the camming rod member 42 to permit the two U-shaped members 40 and 41 to move to their original positions by the restoring force of the resilient conductive clamps 2, as best illustrated in FIG. 7.

It is noted that since the contacting faces of the flat pins of the semiconductors to be tested are parallel to the clamping faces of the resilient conductive clamps, the flat pins of the semiconductors will not be deformed and the legs of the resilient conductive clamps will not be damaged. Therefore the socket of this invention is more durable than the conventional socket for testing a semiconductor.

With this invention thus explained, it is apparent that numerous modifications and variations can be made without departing from the scope and spirit of this invention. It is therefore intended that this invention be limited only as indicated in the appended claims.

I claim:

1. A socket for testing a plug-in type semiconductor having two rows of flat pins with two opposite contacting faces extending therefrom, said contacting faces of each row of said flat pins being aligned with one another, said socket comprising:

an elongated base having two rows of mounting seats having two rows of resilient conductive clamps positioned thereon;

an elongated cover mounted on said base and having rows of openings correspondingly formed in said cover with respect to said conductive clamps;

a push member movably mounted between said cover and said base;

a camming rod member mounted between said cover and base for actuating said push member to depress said resilient conductive clamps, urging said resilient conductive clamps to contact said flat pins of said semiconductors when said flat pins are plugged in said openings of said cover of said socket;

the improvement comprising:

said cover having a first two rows of said openings along one side thereof and a second two rows of said openings along the other side thereof, each of said resilient conductive clamps being generally W-shaped and having two receiving portions correspondingly aligned with one of said first and second two rows of said openings, each of said resilient conductive clamps having two pairs of clamping faces which respectively define said receiving portions thereof and which are parallel to said contacting faces of said flat pins of said semiconductor when said semiconductor is inserted in said socket, said push member including a pair of U-shaped members, each of which has a base plate and two side plates at two sides of said base plate, one of said side plates of one of said U-shaped members extending between said two sides plates of the other of said U-shaped members, defining an elongated overlapping section between said U-shaped members in which said camming rod member is mounted, each of said base plates of said U-shaped members having an elongated slot through which said rows of resilient conductive clamps pass, said side plates of said U-shaped members being moved with respect to each other in a direction perpendicular to said contacting faces of said flat pins of said semiconductor by said camming rod member so that said side plates can depress said clamping faces of said resilient conductive clamps to contact said contacting faces of said flat pines of said semiconductor.

* * * * *